US 6,944,292 B2

(12) United States Patent
Witty et al.

(10) Patent No.: US 6,944,292 B2
(45) Date of Patent: Sep. 13, 2005

(54) INSULATION STRIP FOR A POTS SPLITTER CARD

(75) Inventors: Amy J. Witty, Prior Lake, MN (US); Jason Piehl, Apple Valley, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 647 days.

(21) Appl. No.: 09/815,386

(22) Filed: Mar. 22, 2001

(65) Prior Publication Data

US 2002/0136396 A1 Sep. 26, 2002

(51) Int. Cl.[7] .................................. H04M 1/00; H04M 9/00
(52) U.S. Cl. ............................ 379/413.04; 379/413.02; 379/413.03
(58) Field of Search ..................... 379/413.02–413.04, 379/399.01; 361/748–750; 439/55–85

(56) References Cited

U.S. PATENT DOCUMENTS

| | | | | | |
|---|---|---|---|---|---|
| 3,960,436 | A | * | 6/1976 | Minks et al. | 439/660 |
| 4,197,945 | A | * | 4/1980 | Sherwood | 206/706 |
| 4,567,543 | A | | 1/1986 | Miniet | |
| 5,106,313 | A | * | 4/1992 | Lwee et al. | 439/135 |
| 5,800,187 | A | * | 9/1998 | Vermon et al. | 439/92 |
| 5,892,663 | A | | 4/1999 | Bolinger et al. | |
| 6,159,040 | A | * | 12/2000 | Chang et al. | 439/541.5 |
| 6,359,237 | B1 | * | 3/2002 | Tohya et al. | 379/413.04 |
| 6,438,226 | B1 | * | 8/2002 | Guenther et al. | 379/413.04 |
| 6,545,868 | B1 | * | 4/2003 | Kledzik et al. | 379/413.04 |
| 2002/0118820 | A1 | * | 8/2002 | Sinclair, III et al. | 379/413.04 |
| 2003/0190838 | A1 | * | 10/2003 | Magyar et al. | |

FOREIGN PATENT DOCUMENTS

| EP | 0 891 067 A2 | 1/1999 |
|---|---|---|
| EP | 0 909 102 A2 | 4/1999 |

OTHER PUBLICATIONS

"BroadWire™ 120: High Density ADSL Splitter", *ADC Telecommunications, Inc.*, 8 pages (Sep. 2000).
"BroadWire™ 240: High Density ADSL, Splitter", *ADC Telecommunications, Inc.*, 8 pages (Sep. 2000).
"BroadWire™ 528: High Density ADSL Splitter", *ADC Telecommunications, Inc.*, 8 pages (Sep. 2000).
"DSL POTS Splitter Shelf Family", *Corning Cable Systems LLC*, 8 pages (Sep. 2000).
"High Density xDSL Central Office Splitter: PS–1000 Series", *Wilcom*, 2 pages (Apr. 2000).
"Product Information for Multiple Dwelling Unit, ISDN", *ADC Telecommunications, Inc.*, 4 pages (Sep. 8, 2000).
"Product Information", *mPhase Technologies*, 3 pages (no date).
"Product Release: Wilcom Announces Highest Density CO ADSL POTS Splitter Series", *Wilcom*, 2 pages (Nov. 6, 2000).
"PS–1103 ADSL Central Office Line Filter Shelf: Quick Step Installation Instructions for PS–1103 Shelf", *Wilcom*, 2 pages (Jun. 2000).
"PS–1103 CO POTS Splitter: High Density xDSL Central Office Splitter", *Wilcom*, 2 pages (Jul. 2000).
"PS–1103 CO POTS Splitter: High Density xDSL Central Office Splitter", *Wilcom*, 2 pages (Nov. 2000).

* cited by examiner

*Primary Examiner*—Sinh Tran
*Assistant Examiner*—Ramnandan Singh
(74) *Attorney, Agent, or Firm*—Merchant & Gould P.C.

(57) ABSTRACT

A splitter card including a circuit board on which line, data and voice connectors are mounted. The connectors include contacts electrically connected to termination posts that extend through the circuit board such that ends of the termination posts are exposed. A plurality of splitters are connected to the circuit board for splitting composite signals into voice and data signals. The circuit board includes conductive paths for directing composite signals from the line connector to the splitters, for directing voice signals from the splitters to the voice connectors, and for directing data signals from the splitters to the data connectors. Dielectric insulator members are connected to the circuit board to cover the exposed ends of the termination posts.

33 Claims, 10 Drawing Sheets

INSULATION STRIP FOR A POTS SPLITTER CARD

BACKGROUND OF THE INVENTION

Telecommunications systems commonly include cables containing bundles of twisted pairs of conductors for transmitting telecommunications signals (e.g., voice only signals, data only signals, and combined/mixed voice and data signals, etc.). In these systems, mating connectors (e.g., 25 pair Telco or Amp connectors) are used to couple the cables to telecommunications equipment for processing. In a twisted pair telephone carrier system servicing residential and/or businesses, the system may include an MDF (Main Distribution Frame), a POTS (Plain Old Telephone Service) splitter for separating voice and date signals, and a DSLAM (Digital Subscriber Line Access Multi-Plexer).

For most systems, it is desirable to maximize the splitter densities. To maximize splitter densities, multiple splitters (e.g., 24 splitters) are commonly mounted on a printed circuit board to form a splitter card. Connectors are also typically mounted on the printed circuit board. Often, the connectors have exposed termination posts (i.e., leads). The exposed termination posts can also cause short circuits if inadvertently contacted. What is needed is an isolation structure that prevents the termination posts from being directly touched during installation, removal or servicing of a card assembly.

SUMMARY OF THE INVENTION

One aspect of the present invention relates to a splitter card including a circuit board. Line, data and voice connectors are connected to the circuit board. The connectors include contacts electrically connected to termination posts that extend through the circuit board such that ends of the termination posts are exposed. A plurality of splitters are also connected to the circuit board for splitting composite signals into voice and data signals. The circuit board includes conductive paths for directing composite signals from the line connector to the splitters, for directing voice signals from the splitters to the voice connectors, and for directing data signals from the splitters to the data connectors. Dielectric insulator members are connected to the circuit board to cover the exposed ends of the termination posts.

A variety of advantages of the invention will be set forth in part in the description that follows, and in part will be apparent from the description, or may be learned by practicing the invention. It is to be understood that both the foregoing general description and the following detailed description are exemplary and explanatory only and are not restrictive of the invention as claimed.

While the invention is amenable to various modifications and alternative forms, specifics thereof have been shown by way of example in the drawings and will be described in detail below. It is to be understood, however, that the intention is not to limit the invention to the particular embodiments described. On the contrary, the invention is intended to cover all modifications, equivalents, and alternatives falling within the scope of the invention as defined by the appended claims.

DETAILED DESCRIPTION

In the following detailed description, references are made to the accompanying drawings that depict various embodiments in which the invention may be practiced. It is to be understood that other embodiments may be utilized, and structural and functional changes may be made without departing from the scope of the present invention.

Figure 1:
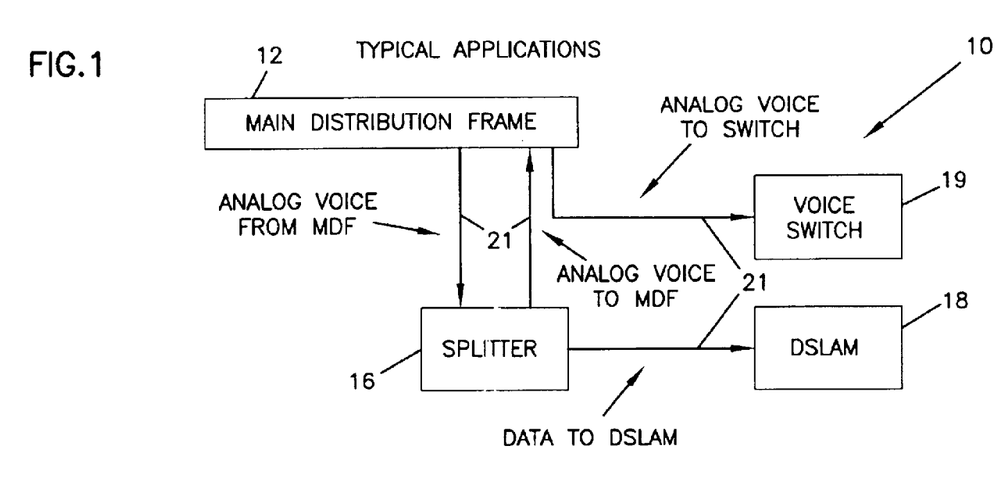
FIG. 1 is a diagram of a telecommunications system including an MDF, a splitter device, a DSLAM, and a voice switch.

Referring now to FIG. 1, a telecommunications system 10 is shown including an arrangement of equipment. The system 10 is representative of a telephone carrier's system for transmitting voice and data to residences and businesses. A main distribution frame (MDF) 12 is linked to a splitter device 16 (e.g., a card including POTS splitter circuits or ISDN splitter circuits). The MDF 12 is also linked to one or more DSLAM modules 18, and a voice switch 19 (e.g., a switch equipped with POTS interface line cards or ISDN interface line cards).

In use of the system 10, the splitter device 16 receives a mixed voice and data signal from the MDF 12. The splitter device 16 splits the mixed signal into split signals, and then filters the split signals. For example, one of the split signals can be filtered to provide a voice only signal (i.e., the high frequency data portion of the signal is filtered out), while the other split signal can be filtered to provide a data only signal (i.e., the low frequency voice portion of the signal is filtered out). The data only signals are passed from the splitter device 16 to the DSLAM 18. The voice only signals are passed from the splitter device 16 to the MDF 12 for transmission to the voice switch 19.

Figure 2:
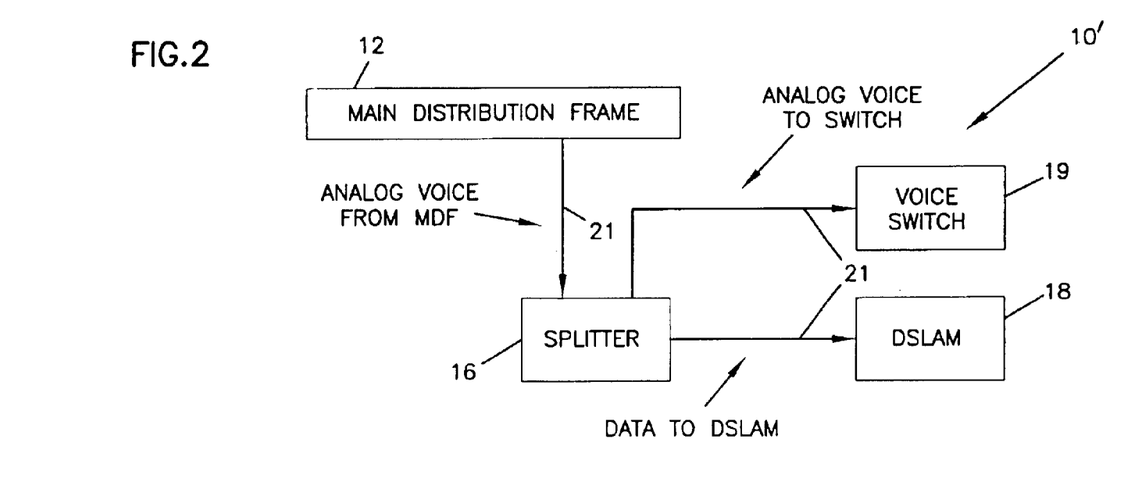
FIG. 2 is another telecommunications system including an MDF, a splitter device, a DSLAM, and a voice switch.

FIG. 2 shows a similar telecommunications system 10' having the same components as those described with respect to the telecommunications system 10' of FIG. 1. However, in the embodiment of FIG. 2, voice signals are transmitted directly from the splitter device 16 to the voice switch 19.

Referring still to FIGS. 1 and 2, the MDF 12, the POTS splitter device 16, the DSLAM 18 and the voice switch 19 are typically interconnected by cables 21. The cables 21 preferably each include multiple pairs of conductors for transmitting separate twisted pair signals. By way of example, the cables 21 can comprise 25 pair cables (i.e., cables each containing 25 pairs of wire conductors for transmitting 25 separate twisted pair signals). Multi-pair connectors are used to provide interconnections between the cables 21 and the components of the telecommunications system 10. For example, multi-pair connectors are typically provided at the ends of the cables 21. The multi-pair connectors at the ends of the cables 21 are commonly coupled to corresponding multi-pair cable connectors mounted at the equipment to provide connections therein between.

Figure 3A:
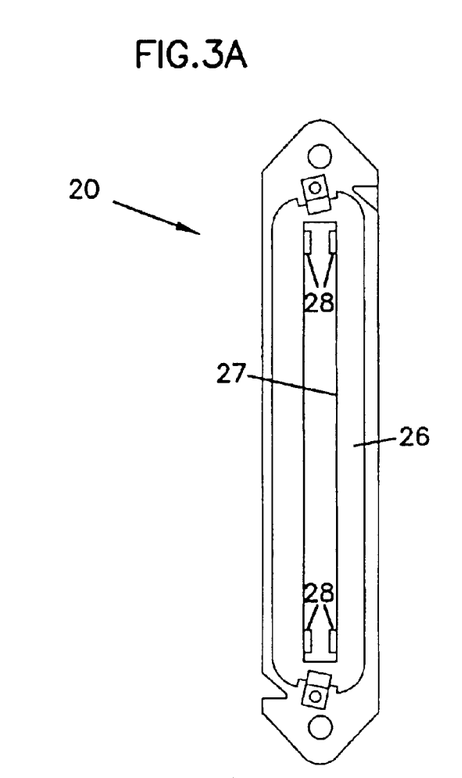
FIGS. 3A and 3B are front and side views of an exemplary twenty-five pair cable connector.
Figure 3B:
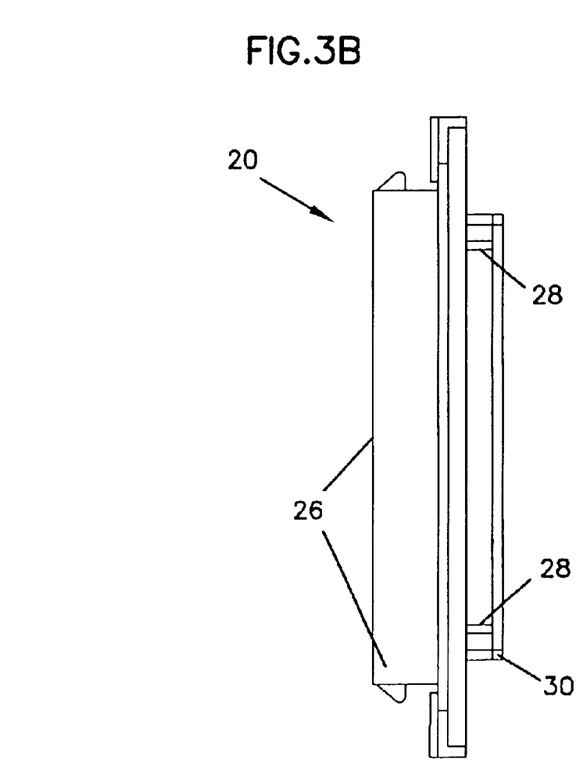

An exemplary multi-pair cable connector 20 is shown in FIGS. 3A and 3B. The depicted connector 20 is a conventional connector such as a Telco or Amp connector. Preferably, the connector 20 is adapted for use with a 25 pair cable. Thus, the conductor 20 preferably includes 25 pairs of conductors 28. For clarity, only two of the pairs of conductors 28 are shown in FIGS. 3A and 3B.

The connector 20 includes a first end 26 defining a receptacle 27 sized for receiving a portion of a mating connector (not shown) connected at the end of a cable. The pairs of conductors 28 are positioned within the receptacle 27, and are adapted to contact corresponding conductor pairs of the mating connector. The conductors 28 extend through the connector 20 from the first end 26 to a second end 30. Portions of the conductors 28 located at the second end 30 are used to provide connections to conductor pairs of cables, wires, circuit boards, equipment, etc.

Figure 4:
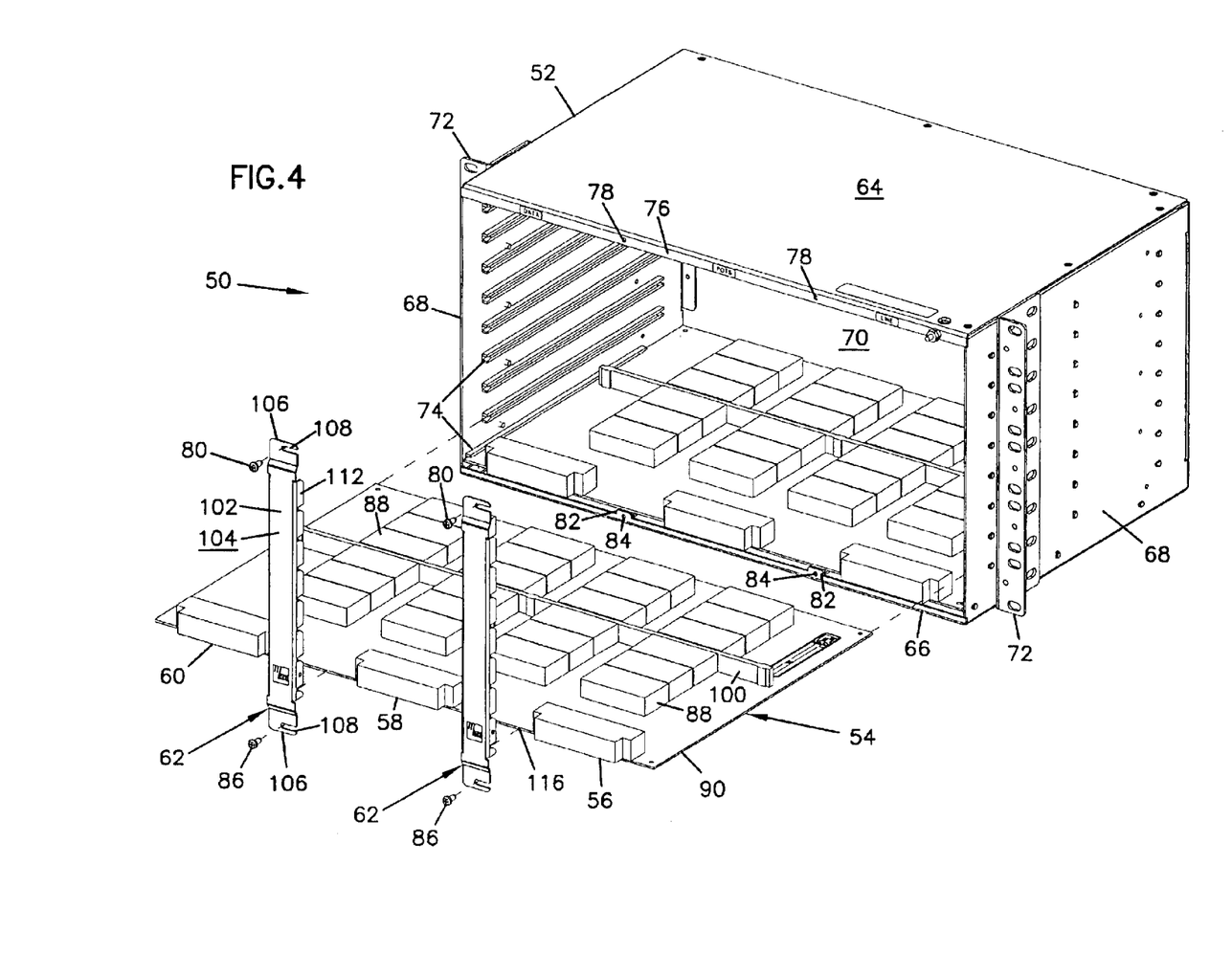
FIG. 4 is an exploded view of a POTS splitter assembly constructed in accordance with the principles of the present invention.
Figure 5:
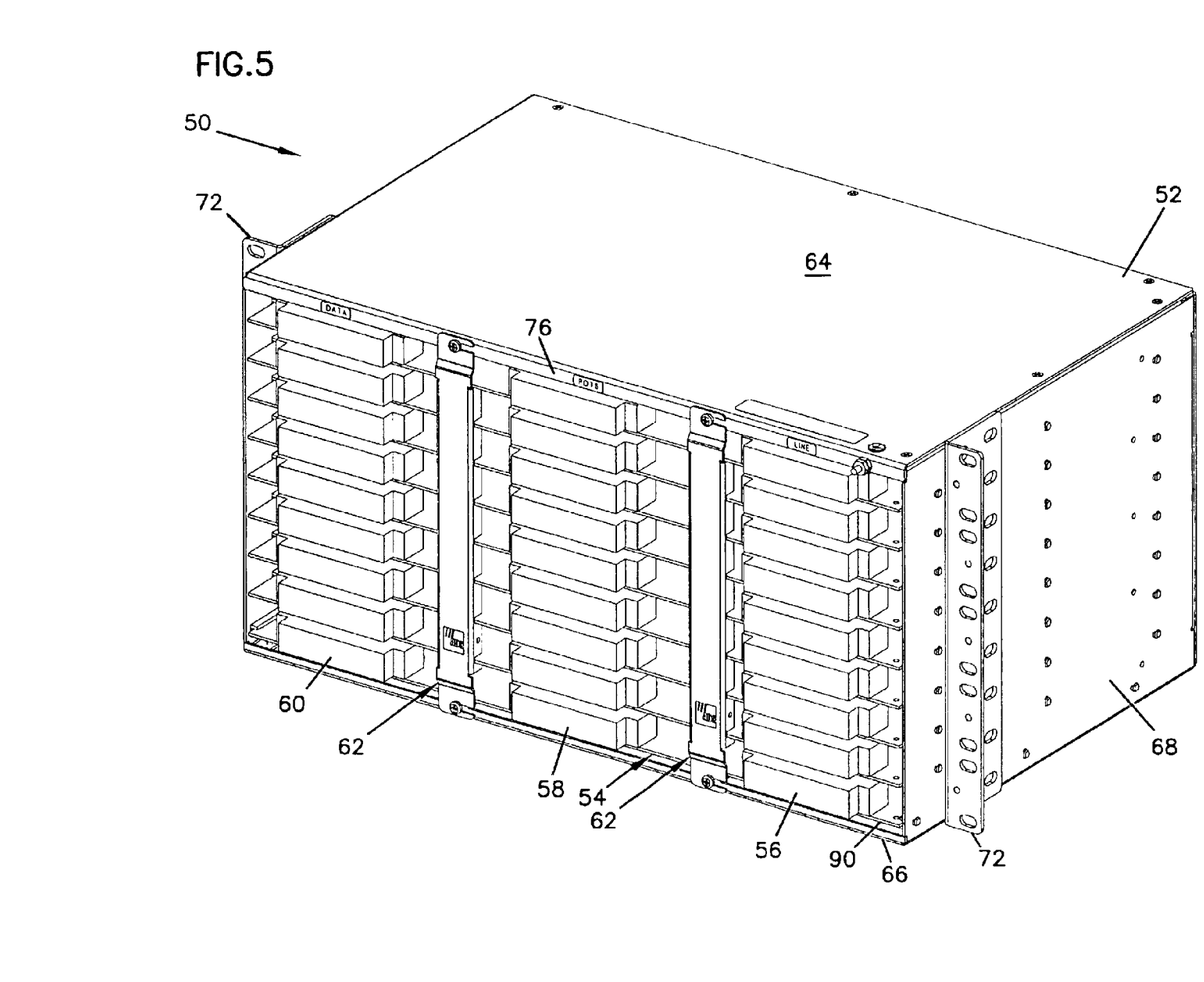
FIG. 5 is a perspective view of the POTS splitter assembly of FIG. 4 shown fully loaded.
Figure 6:
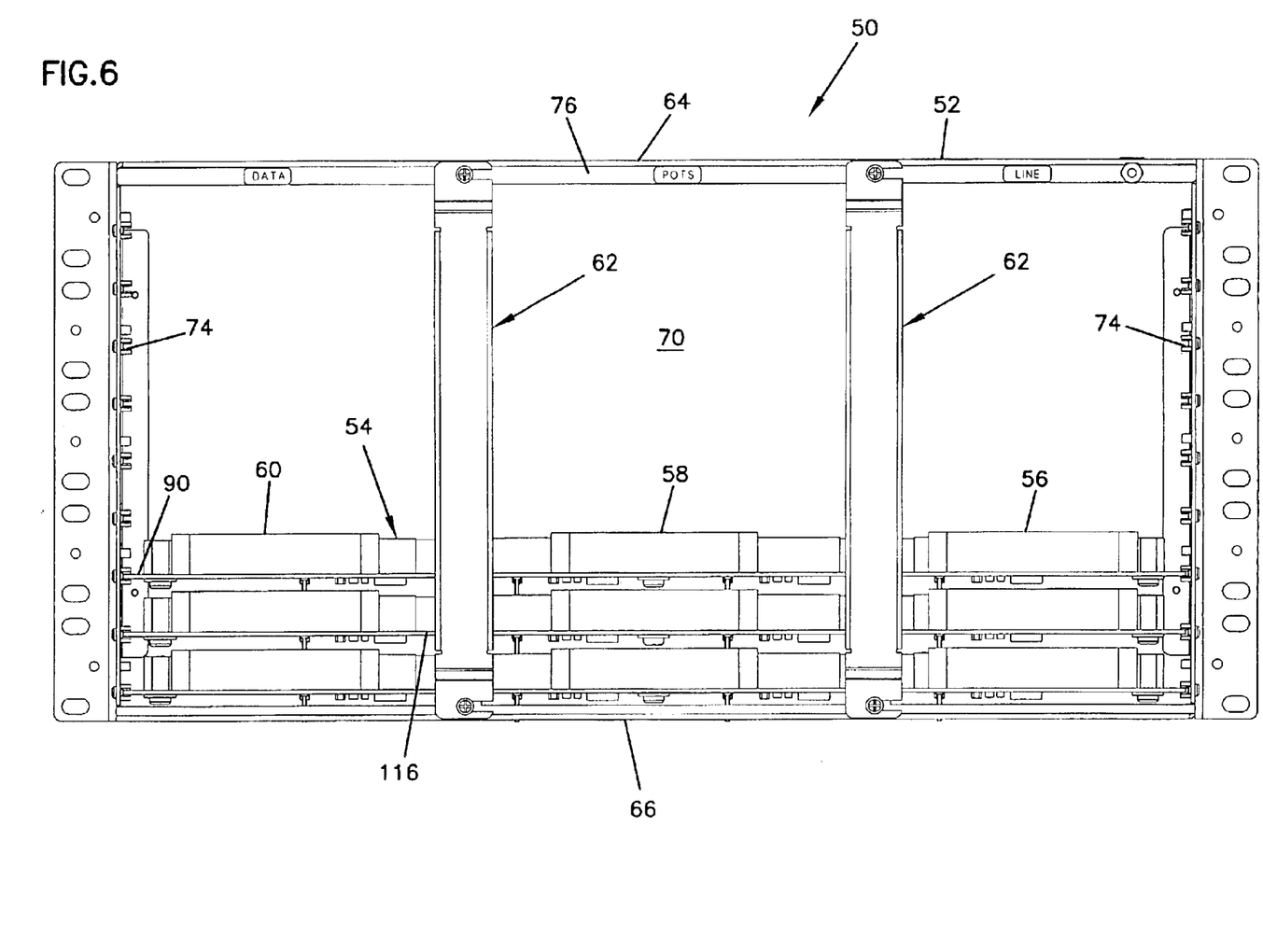
FIG. 6 is a front view of the POTS splitter assembly of FIG. 4 with several splitter cards mounted within the chassis.

FIGS. 4-6 illustrate a POTS splitter assembly 50 constructed in accordance with the principles of the present invention. The splitter assembly 50 includes a generally rectangular chassis 52 for mounting a plurality of POTS splitter cards 54 or other cards. The splitter cards 54 are preferably horizontally mounted within the chassis 52. Each of the splitter cards 54 preferably includes a line connector 56 (i.e., a connector for inputting/outputting composite voice/data signals), a POTS connector 58 (i.e., a connector for inputting/outputting voice signals) and a data connector 60 (i.e., a connector for inputting/outputting data). When the chassis 52 is fully loaded as shown in FIG. 5, the line connectors 56, the POTS connectors 58 and the data connectors 60 are respectively aligned in separate vertical columns. Retaining brackets 62 are mounted between the columns for retaining the splitter cards 54 within the chassis 52.

As best shown in FIG. 4, the chassis 52 is generally rectangular and includes opposing top and bottom walls 64 and 66 interconnected by opposing side walls 68. A back panel 70 preferably encloses the back of the chassis 52, while the front of the chassis 52 is preferably open so as to allow the splitter cards 54 to be inserted within the chassis 52. Side mounting flanges 72 are connected to the outer surfaces of the side walls 68. The side mounting flanges 72 allow the chassis 52 to be readily connected to a conventional telecommunications rack or frame. Horizontal tracks 74 are mounted on the inner surfaces of the side walls 68. The tracks 74 define channels for receiving left and right edges of the splitter cards 54. As best shown in FIG. 6, corresponding pairs of the tracks 74 oppose one another. The pairs of tracks 74 are vertically spaced-apart from one another so that the splitter cards 54 mounted within the tracks 74 are vertically spaced-apart and each held in a generally horizontal orientation.

Still referring to FIG. 4, the front of the chassis 52 includes structure for mounting the retaining brackets 62. For example, the front of the chassis 52 includes a top flange 76 that projects downwardly from the top wall 64 of the chassis 52. The top flange 76 defines openings 78 for receiving top fasteners 80 (e.g., bolts or screws) used to secure the top ends of the mounting brackets 62 to the top flange 76. The front end of the chassis 52 also includes two lower tabs 82 that project upwardly from the bottom wall 66 of the chassis 52. The lower tabs 82 define openings 84 for receiving lower fasteners 86 used to secure the bottom ends of the retaining brackets 62 to the chassis 52.

Figure 7A:
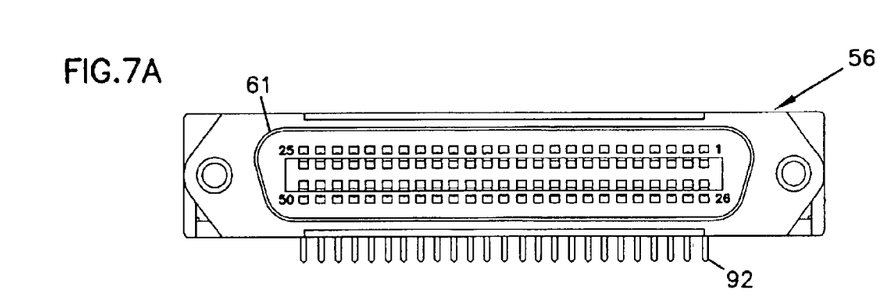
FIG. 7A is a front end view of a conventional 25 pair, right angle connector.
Figure 7B:
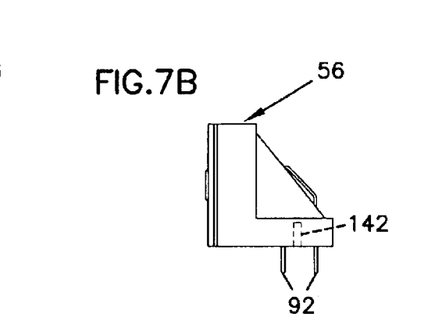
FIG. 7B is a side view of the right angle connector of FIG. 7A.

The connectors 56, 58 and 60 of the splitter cards 54 are preferably conventional 25-pair (i.e., 50 pin) connectors. FIGS. 7A and 7B show one of the connectors 56. It will be appreciated that the connectors 58 and 60 have identical configurations as the depicted connector 56.

The connector 56 shown in FIGS. 7A and 7B includes a receptacle 61 in which 50 contacts are located. Opposing contacts are paired with one another. For example, as labeled on FIG. 7A, contacts 1–25 are respectively paired with contacts 26–50. Each of the contacts includes a terminal post 92 (i.e., a lead) for electrically connecting the contacts to corresponding circuit boards. As shown in FIG. 7B, the connector 56 is depicted as a right-angle connector. Suitable connectors as shown in FIGS. 7A and 7B are sold by Kycon, Inc. of San Jose, Calif. or AMP of Harrisburg, Pa., a division of Tyco Electronics.

The splitter cards 54 of the splitter assembly each include a plurality of POTS splitters 88 (e.g., 24 splitters) or other types of splitters mounted on a circuit board 90. The circuit board 90 electrically connects the POTS splitters 88 to the connectors 56, 58 and 60.

The POTS splitters 88 of the splitter cards 54 can have a number of different configurations. For example, the splitters 88 can include conventional POTS splitter circuits. A conventional POTS splitter circuit functions to split a composite signal (i.e., a mixed voice/data signal) into two composite signals. One of the split composite signals is typically passed through one or more low pass filters capable of passing the relatively lower frequency voice content of the composite signal (e.g., less than about 4 kilohertz) and rejecting the composite signal content above the voice band (e.g., 30 kilohertz and above). The other split composite signal can be passed through a high pass filter that passes the composite signal content associated with the data band (e.g., about 30 kilohertz and above), and rejects the relatively lower frequency voice content of the composite signal. Alternatively, the other split signal can be unfiltered such that the signal remains a composite signal. For such an embodiment, it is assumed that the DSLAM or other digital multiplexer that ultimately receives the composite signal will provide any required high-pass filter elements to remove the relatively low frequency voice signal content of the composite signal. It will further be appreciated that ISDN filter circuits could also be used.

As described above, the connectors 58, 60 and 62 preferably include 25 pairs of contacts. Typically, one of the 25 pairs of contacts in each of the cable connectors 56, 58 and 60 is grounded or inactive. The remaining 24 contact pairs provided in each of the connectors 56, 58 and 60 are electrically connected to corresponding splitters 88. Thus, each splitter card 54 has 24 separate splitter circuits and has the capacity to process 24 separate twisted pair signals. Of course, the capacity of the splitter cards 54 can be varied. For example, in certain embodiments it may be desirable to provide more or fewer splitters at each card (e.g., any number of splitters can be provided such as 8, 24, 48, 96, etc.). Thus, the number of separate circuit paths provided by the splitter cards can be varied accordingly.

Figure 8:
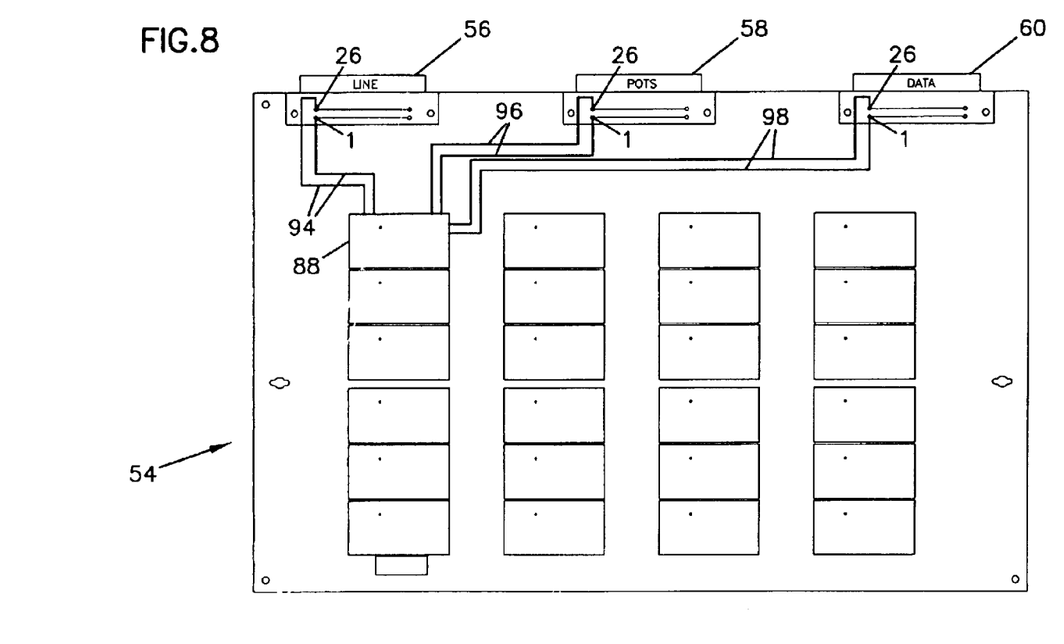
FIG. 8 is a schematic depiction of an exemplary splitter card suitable for use in the POTS splitter assembly of FIGS. 4 and 5.

FIG. 8 is a schematic representation of one of the splitters 54. In FIG. 8, only one twisted pair circuit is shown. The circuit includes first tracings 94 electrically connecting the first and twenty-sixth contacts of the line connector 56 to a corresponding POTS splitter 88. The circuit also includes second tracings 96 electrically connecting the POTS splitter 88 to the first and twenty-sixth contacts of the POTS connector 58. The circuit further includes third tracings 98 that electrically connect the POTS splitter 88 to the first and twenty-sixth contacts of the data connector 60.

In use, a composite signal is inputted into the splitter card 54 through the line connector 56. From the line connector 56, the composite signal is carried to a corresponding one of the POTS splitters 88. At the POTS splitter 88, the composite signal is split into a high frequency data signal and a low frequency voice signal. The high frequency data signal is conveyed from the POTS splitter 88 to the data connector 60 through tracings 98. The low frequency voice signal is conveyed from the POTS splitter 88 to the POTS connector 58 through tracings 96.

Due to the relatively large distance traversed across the width of the chassis 52 (e.g., about 18 inches), the circuit boards 90 of the splitter cards 54 have a tendency to bow in response to gravity. This bowing is particularly an issue when cables are connected to the card connectors 56, 58 and 60 because the weight of the cables can cause the cards 54 to sag. This sagging adds stress to the circuit boards 90 and connectors 56, 58 and 60. To resist this tendency, a reinforcing rib 100 (shown in FIG. 4) is mounted on the top side of each circuit board 90. Additionally, as described below, each of the card-retaining brackets 62 includes structure for supporting the front edges of the circuit boards 90 at intermediate positions between the side walls 68 of the chassis 52.

Figure 9A:
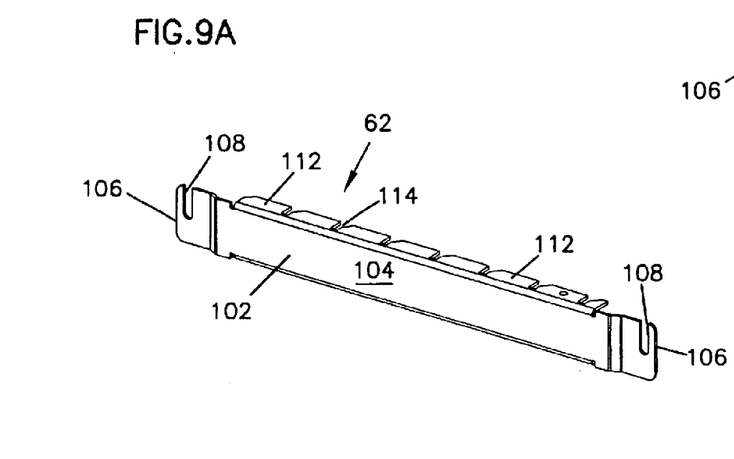
FIG. 9A is a front, perspective view of one of the retaining brackets shown in the POTS splitter assembly of FIG. 4.
Figure 9B:
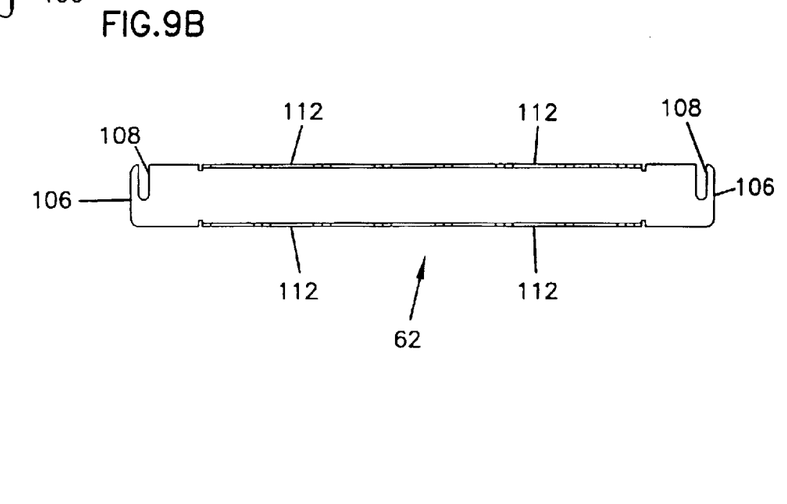
FIG. 9B is a back view of the retaining bracket of FIG. 9A.

As shown in FIGS. 9A–9B, the card-retaining brackets 62 each include a front portion 102 defining a front face 104. The retaining brackets 62 also include top and bottom mounting flanges 106 defining open-ended slots 108 for receiving the fasteners 80 and 86. The open-ended slots 108 allow the retaining brackets 62 to be removed from the chassis 52 without completely removing the fasteners 80 and 86 (shown in FIG. 4) from their respective openings 78 and 84.

The top and bottom mounting flanges 106 are preferably recessed (i.e., rearwardly offset) relative to the front portion 102. This rearward offset is preferably provided by offset portions 109 (best shown in FIG. 9C) that are aligned at oblique angles relative to the front portion 102 and the mounting flanges 106.

Figure 9C:
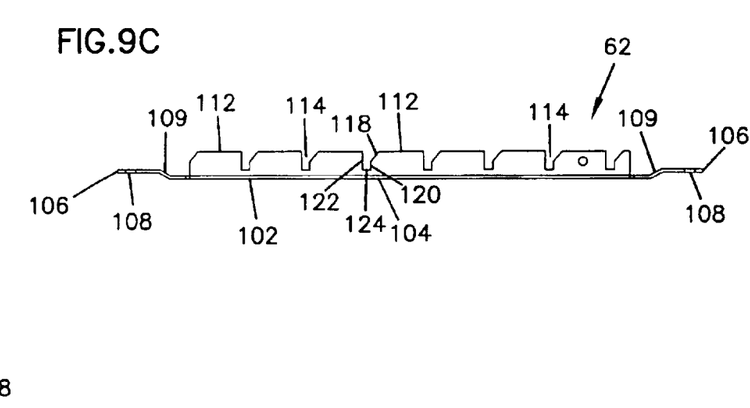
FIG. 9C is a side view of the retaining bracket of FIG. 9A.

The retaining brackets 62 each include a plurality of card support members 112 that project rearwardly from the front portion 102. The card support members 112 are arranged in pairs with each pair corresponding to one of the POTS splitter cards 54. The pairs of support members 112 define two columns of support members 112 that extend along left and right edges of the retaining brackets 62. When mounted on the chassis 52, the columns extend in a vertical orientation.

The card support members 112 cooperate to define notches 114 for receiving front edges 116 of the circuit boards 90. Each of the notches 114 is defined by a ramp surface 118 and a support surface 120 (see FIGS. 9C and 10B). Each of the notches 114 is also defined by an opposing surface 122 that opposes the support surface 120. Notch end walls 124 extend between the surfaces 120 and 122. In use, the ramp surfaces 118 function to guide the front edges 116 of the circuit boards 90 into their corresponding notches 114 on the retaining brackets 62. Once the circuit boards 90 are fully received within the notches 114, the front edges of the circuit boards 90 are captured between the opposing surfaces 120 and 122 (see FIG. 10B). As so positioned, vertical movement of the circuit boards 90 is resisted. Additionally, the support surfaces 120 provide support at intermediate locations of the circuit boards 90 (i.e., at locations between the tracks 74) to prevent the circuit boards 90 from bowing. Moreover, the notch end walls 124 retain the cards 54 within the chassis 52.

In one non-limiting embodiment, the brackets 62 are made by bending sheet metal to form a "C" shaped channel. The notches 114 are cut into the channel walls to form the individual card support members 112.

A lack of clearance prevents the brackets 62 from having card support members 112 corresponding to the lowermost splitter card. To better support the front edge of this card, the lowermost card's corresponding tracks 74 are forwardly extended as compared to the other tracks 74 (see FIG. 4). Also, reinforcing tabs (not shown) can project upwardly from the bottom wall 66 to provide intermediate support to the lowermost card 54.

Figure 10A:
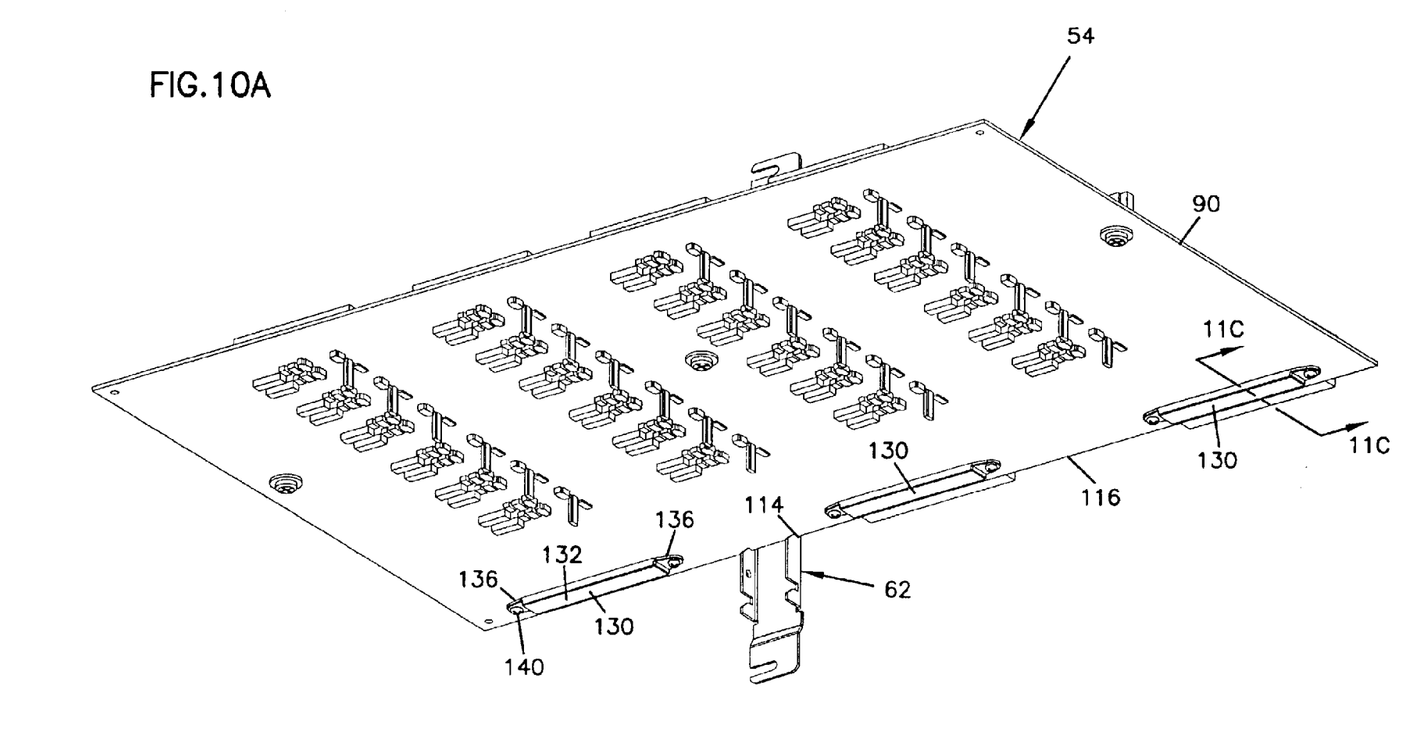
FIG. 10A is a bottom, perspective view showing the retaining bracket of FIGS. 9A—9C supporting one of the splitter cards.
Figure 10B:
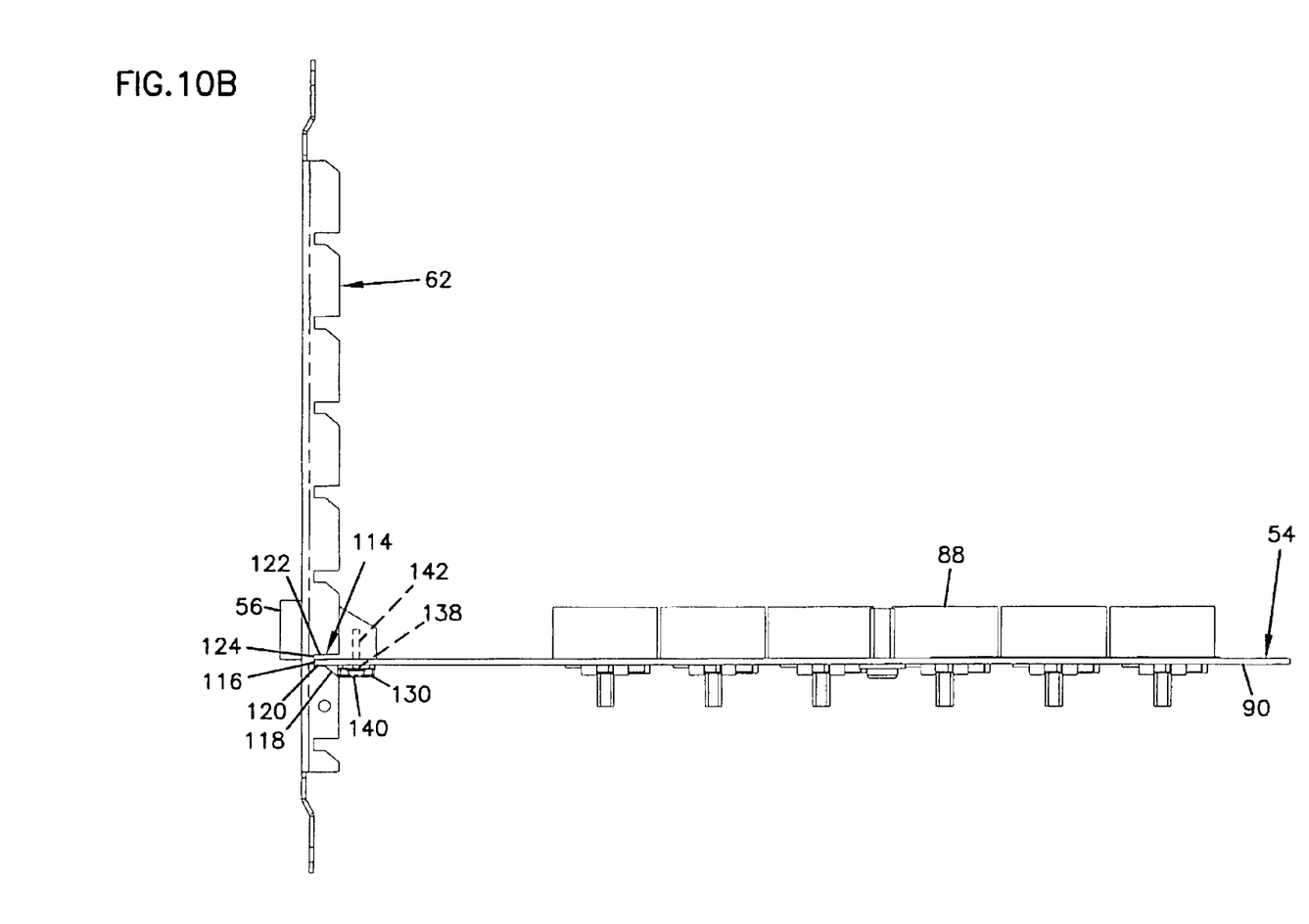
FIG. 10B is a side view showing the retaining bracket of FIGS. 9A–9C supporting one of the splitter cards.
Figure 11A:
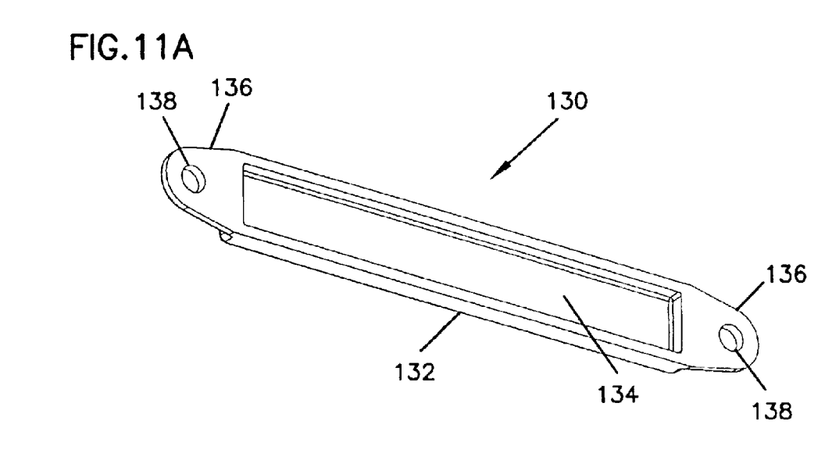
FIG. 11A is a top perspective view of a insulator strip constructed in accordance with the principles of the present invention.
Figure 11B:
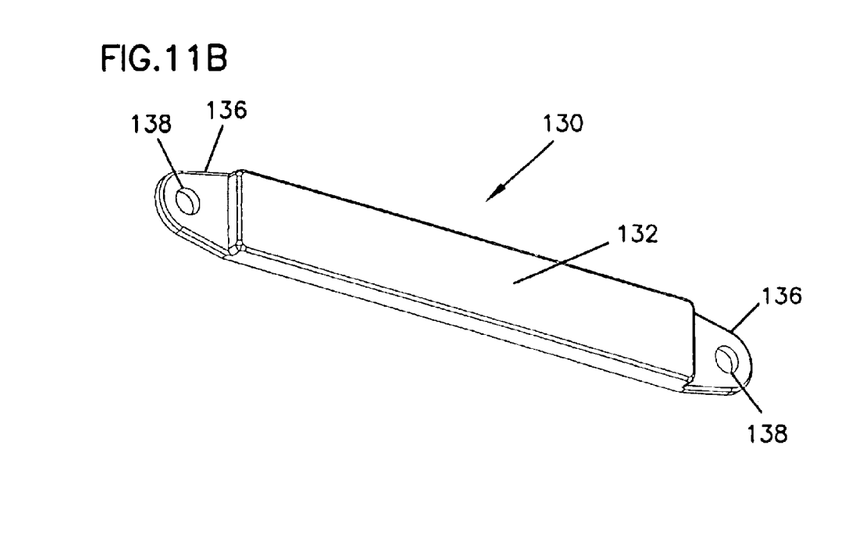
FIG. 11B is a bottom perspective view of the insulator strip of FIG. 11A.

As shown in FIGS. 10A and 10B, the POTS splitter cards 54 also include protective, insulator strips 130 preferably made of a dielectric material such as plastic. As best shown in FIGS. 11A and 11B, each strip 130 has a generally rectangular midportion 132. The midportions 132 define rectangular recesses 134 (i.e., chambers) for receiving the terminal posts 92 of the connectors 56, 58 and 60. The rectangular recesses 134 preferably extend lengthwise along a majority of a length of each insulator strip 130.

Preferably, each recess 134 is sized to receive all 50 termination posts 92 of a standard 25 pair connector (as shown in FIGS. 7A and 7B). In one embodiment, the recess 134 has a length of at least 2 inches (the approximate length of a typical terminal post lay-out) and a width of at least 0.16 inches (the approximate width of a typical terminal post lay-out). Preferably, the recess 134 has a depth of at least 0.07 inches. In one embodiment, the recess has a depth in the range of 0.05–0.1 inches, a length in the range of 2–3 inches and a width in the range of 0.16–0.60 inches.

The insulator strips 130 also include mounting flanges 136 that project outward from opposite ends of the rectangular midportion 132. The mounting flanges 136 have rounded ends. Preferably, the mounting flanges 136 have thicknesses less than corresponding thicknesses of the rectangular midportions 132. In one particular embodiment, each mounting flange 136 has a thickness less than one-half a thickness of the corresponding rectangular midportion 132. The mounting flanges 136 define openings 138 for receiving fasteners 140 (e.g., screws as shown in FIG. 10A). Preferably, the flanges 136 are sufficiently recessed relative to the midportion 132 for the fastener heads not to project appreciably beyond the midportion 132 when installed.

Figure 11C:
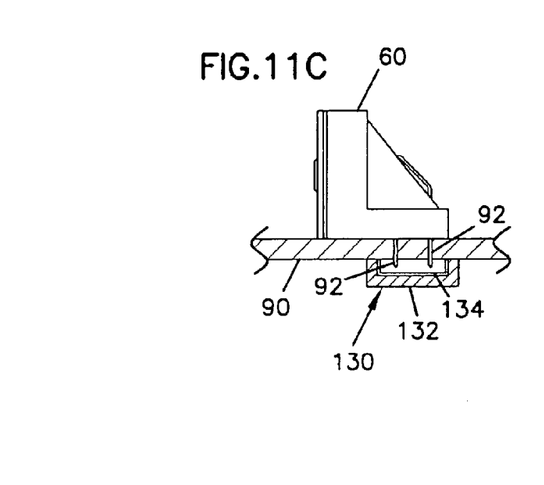
FIG. 11C is a cross-sectional view taken along section line 11C—11C of FIG. 10A.

In use, the insulator strips 130 are mounted to the underside of each splitter card 54 as shown in FIGS. 10A and 10B. Preferably, the strips 130 are mounted through the use of the fasteners 140 which extend through the openings 138 defined through the mounting flanges 136 and also extend through corresponding openings defined by the circuit board 90. Preferably, the fasteners 140 also extend into threaded holes 142 (shown in FIG. 10B) defined by the connectors 56, 58 and 60. In this manner, the fasteners both stabilize the connectors 56, 58 and 60 and hold the strips 130 in place. With the strips 130 fastened to the board 90, the terminal post 92 of the connectors 56, 58 and 60 extend within the rectangular recesses 134 of the insulator strips 130 (see FIG. 11C). In this manner, the strips 130 cover the terminal post 92 to prevent the posts from being inadvertently contacted.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A telecommunications assembly comprising:
   A) a chassis;
   B) a plurality of splitter cards mounted within the chassis, each of the splitter cards including:
      a circuit board;
      a line connector connected to the circuit board;
      a data connector connected to the circuit board;
      a voice connector connected to the circuit board;
      a plurality of splitters connected to the circuit board;
      the connectors including contacts electrically connected to termination posts that extend through the circuit board such that ends of the termination posts are exposed;
      the circuit board including conductive paths for electrically connecting the line, data and voice connectors to the splitters; and
   C) dielectric insulator members connected to the circuit boards so as to cover the exposed ends of the termination posts.

2. The telecommunications assembly of claim 1, wherein the line, data and voice connectors are 50 pair connectors, and wherein each splitter card includes 24 splitters.

3. The telecommunications assembly of claim 1, wherein the splitter cards are stacked vertically within the chassis.

4. The telecommunications assembly of claim 1, wherein the dielectric insulator members are fastened to the circuit boards.

5. The telecommunications assembly of claim 1, wherein the dielectric insulators are strips.

6. The telecommunications assembly of claim 5, wherein the strips each include a generally rectangular midportion and mounting flanges that project outwardly from the mid portion, the mounting flanges defining openings for receiving fasteners.

7. The telecommunications assembly of claim 6, wherein the mounting flanges are thinner than the midportion.

8. The telecommunications assembly of claim 7, wherein the midportion defines a recess for receiving the exposed ends of the termination posts.

9. The telecommunications assembly of claim 8, wherein the recess is generally rectangular.

10. A splitter card comprising:
    a circuit board;
    a first connector connected to the circuit board;
    a second connector connected to the circuit board;
    a third connector connected to the circuit board;
    a plurality of splitters connected to the circuit board;
    the connectors including contacts electrically connected to termination posts that extend through the circuit board such that ends of the termination posts are exposed; and
    dielectric insulator members connected to the circuit board so as to cover the exposed ends of the termination posts.

11. The splitter card of claim 10, wherein the first, second and third connectors are 50 pair connectors, and wherein the splitter card includes 24 splitters.

12. The splitter card of claim 10, wherein the dielectric insulator member is fastened to the circuit board.

13. The splitter card of claim 10, wherein the dielectric insulator is a strip.

14. The splitter card of claim 13, wherein the strip includes a generally rectangular midportion and mounting flanges that project outwardly from the mid portion, the mounting flanges defining openings for receiving fasteners.

15. The splitter card of claim 14, wherein the mounting flanges are thinner than the midportion.

16. The splitter card of claim 15, wherein the midportion defines a recess for receiving the exposed ends of the termination posts.

17. The splitter card of claim 16, wherein the recess is generally rectangular.

18. A telecommunications card comprising:
    a circuit board;
    one or more telecommunications connectors connected to the circuit board;
    the connectors including contacts electrically connected to termination posts that extend through the circuit board such that ends of the termination posts are exposed; and
    dielectric insulator members connected to the circuit board so as to cover the exposed ends of the termination posts.

19. The telecommunications card of claim 18, wherein the dielectric insulator member is fastened to the circuit board.

20. The telecommunications card of claim 18, wherein the dielectric insulator is a strip.

21. The telecommunications card of claim 20, wherein the strip includes a generally rectangular midportion and mounting flanges that project outwardly from the mid portion, the mounting flanges defining openings for receiving fasteners.

22. The telecommunications card of claim 21, wherein the mounting flanges are thinner than the midportion.

23. The telecommunications card of claim 22, wherein the midportion defines a recess for receiving the exposed ends of the termination posts.

24. The telecommunications card of claim 23, wherein the recess is generally rectangular.

25. The telecommunication card of claim 18, further comprising fasteners that provide a dual function of connecting the insulator members to the circuit board and stabilizing the connectors.

26. An insulator for covering exposed termination posts projecting from a circuit board of a telecommunications device, the insulator comprising:
    an elongated dielectric strip including a midportion and two mounting flanges that project outwardly from opposite ends of the midportion, the strip being constructed to mount to a circuit board;
    the mounting flanges defining openings for receiving fasteners; and the mid portion defining a recess for receiving the exposed termination posts projecting from the circuit board, the recess having a length that extends along a majority of a total length of the dielectric strip.

27. The insulator of claim 26, wherein the recess is rectangular.

28. The insulator of claim 26, wherein the mounting flanges are thinner than the midportion.

29. The insulator of claim 26, wherein the mounting flanges are rounded.

30. The insulator of claim 26, wherein the recess is sized to receive at least 50 of the termination posts.

31. The insulator of claim 30, wherein the recess has a length in the range of 2–3inches, a width in the range of 0.16–0.60 inches and a depth in the range of 0.05–0.1 inches.

32. A telecommunications assembly comprising:

A) a chassis;

B) a plurality of splitter cards mounted within the chassis, each of the splitter cards including:
   a circuit board;
   a line connector connected to the circuit board;
   a data connector connected to the circuit board;
   a voice connector connected to the circuit board;
   a plurality of splitters mounted to the circuit board;
   the connectors including contacts electrically connected to termination posts that extend through the circuit board such that ends of the termination posts are exposed;
   the circuit board including conductive paths for electrically connecting the line, data and voice connectors to the splitters; and C) dielectric insulator members mounted to the circuit boards so as to cover the exposed ends of the termination posts.

33. A splitter card comprising:

a circuit board;

a first connector connected to the circuit board;

a second connector connected to the circuit board;

a third connector connected to the circuit board;

a plurality of splitters mounted to the circuit board;

the connectors including contacts electrically connected to termination posts that extend through the circuit board such that ends of the termination posts are exposed; and dielectric insulator members mounted to the circuit board so as to cover the exposed ends of the termination posts.

* * * * *